US010895641B2

(12) United States Patent
Lai et al.

(10) Patent No.: US 10,895,641 B2
(45) Date of Patent: Jan. 19, 2021

(54) PROXIMITY SENSING DEVICE

(71) Applicant: Everlight Electronics Co., Ltd., New Taipei (TW)

(72) Inventors: Shih-Wen Lai, New Taipei (TW);
Yi-Ting Huang, New Taipei (TW);
Jing-Hong Lai, New Taipei (TW);
Chih-Hao Hsu, New Taipei (TW);
Chia-Wei Yang, New Taipei (TW);
Chih-Min Lin, New Taipei (TW);
Chieh-Yu Kang, New Taipei (TW);
Kuang-Mao Lu, New Taipei (TW);
Jian-Hong Fan, New Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/363,829

(22) Filed: Mar. 25, 2019

(65) Prior Publication Data

US 2020/0116860 A1    Apr. 16, 2020

Related U.S. Application Data

(60) Provisional application No. 62/745,940, filed on Oct. 15, 2018, provisional application No. 62/753,252, filed on Oct. 31, 2018.

(51) Int. Cl.
*G01S 17/04*   (2020.01)
*H01L 27/32*   (2006.01)
*G01S 7/4911*  (2020.01)

(52) U.S. Cl.
CPC .............. *G01S 17/04* (2020.01); *G01S 7/4911* (2013.01); *H01L 27/3227* (2013.01)

(58) Field of Classification Search
CPC ..... G01S 17/04; G01S 7/4911; H01L 27/3227
See application file for complete search history.

(56) References Cited

U.S. PATENT DOCUMENTS

| | | | |
|---|---|---|---|
| 2015/0365508 A1* | 12/2015 | Kwon ................... | G06F 1/1658 455/566 |
| 2016/0033822 A1* | 2/2016 | Jiang .................. | G02F 1/133602 349/33 |
| 2019/0194539 A1 | 6/2019 | Rajendran et al. | |
| 2019/0346939 A1* | 11/2019 | Na ........................ | G06F 3/0325 |

FOREIGN PATENT DOCUMENTS

| CN | 107770309 A | 3/2018 |
|---|---|---|
| TW | 201925427 A | 7/2019 |
| TW | 201929268 A | 7/2019 |

* cited by examiner

*Primary Examiner* — Hugh Maupin
(74) *Attorney, Agent, or Firm* — Chen Yoshimura LLP

(57) ABSTRACT

A proximity sensing device which is disposed under the OLED panel and has an emitting module and a receiving module, is provided. The emitting module can emit an invisible light which has a peak wavelength not less than 1000 nm. The receiving module is disposed adjacent to the emitting module and can receive a reflecting light from the reflected invisible light. Therefore, the invisible light passing through the OLED panel will not cause a bright spot on the panel.

14 Claims, 9 Drawing Sheets

PROXIMITY SENSING DEVICE

CROSS-REFERENCES TO RELATED APPLICATIONS

This application claims priority to U.S. Patent Application Ser. No. 62/745,940 filed on Oct. 15, 2018 and U.S. Patent Application No. 62/753,252 filed on Oct. 31, 2018, which are hereby incorporated by reference in its entirety.

BACKGROUND OF THE INVENTION

Field of the Invention

The present invention relates to a sensing device, and more particularly, relates to a proximity sensing device.

Descriptions of the Related Art

Organic light emitting diode (OLED) panels have become mainstream of display devices of electronic products, due to advantages thereof such as lightness and thinness, vibration-resistance, clear image displaying, low energy consumption, high light-emitting efficiency and being flexible or the like, and are widely used in mobile devices (e.g., mobile phones or tablets).

For mobile devices, in order to maximize the product screens, manufacturers are recently attempting to move a sensor originally disposed at the bezel around the screen to a lower side (i.e., an inner side, relative to an upper side or an outer side visible to a user) of the screen to reduce the size of the bezel. Thus, the mobile devices may have a larger screen ratio under a fixed external dimension. At present, the sensor which has been relocated to a lower side of the screen includes a fingerprint sensor, a proximity sensor, or the like.

The proximity sensor is configured to detect the degree of proximity of a human body or an object to a mobile phone by the emission and reception of infrared light so as to turn off the backlight and touch control function of the screen of the mobile phone, thereby saving electric power and avoiding unintended contact with the screen while a user is talking on the phone. However, when a conventional proximity sensor is disposed under the OLED panel, the infrared light emitted therefrom will make a semiconductor layer of the OLED panel to generate a visible light (photoluminescence). Thus, the user may observe a bright spot on the OLED panel and consider that the panel is defective.

Accordingly, a need exists in the art to provide a proximity sensing device so as to avoid the possible drawback mentioned above.

SUMMARY OF THE INVENTION

An objective of the present invention is to provide a proximity sensing device, which may be disposed under an OLED panel and is capable of preventing the generation of an unexpected bright spot on the panel.

To achieve the aforesaid objective, a proximity sensing device of the present invention comprises an emitting module and a receiving module. The emitting module is configured to emit an invisible light which has a peak wavelength not less than 1000 nm. The receiving module is disposed adjacent to the emitting module and configured to receive a reflected light of the invisible light.

In an embodiment, the peak wavelength of the invisible light emitted by the emitting module included in the proximity sensing device of the present invention is not greater than 1580 nm.

In an embodiment, the emitting module included in the proximity sensing device of the present invention comprises one or a plurality of emitting elements, and the receiving module thereof comprises one or a plurality of sensing elements.

In an embodiment, the emitting element included in the proximity sensing device of the present invention comprises a semiconductor chip, and the semiconductor chip is configured to emit the invisible light.

In an embodiment, the emitting element included in the proximity sensing device of the present invention comprises a semiconductor chip and a light converting structure. The semiconductor chip is configured to emit a visible light. The light converting structure is disposed on the semiconductor chip and comprises an adhesive (glue) and a fluorescent material, and the fluorescent material is disposed in the adhesive to convert the visible light into the invisible light.

In an embodiment, the emitting element included in the proximity sensing device of the present invention comprises a light absorbing layer, and the light absorbing layer is disposed on the light converting structure to absorb the visible light.

In an embodiment, the light converting structure included in the proximity sensing device of the present invention further comprises a light absorbing material, and the light absorbing material is disposed in the adhesive to absorb a part of the visible light, and the fluorescent material in the adhesive is configured to covert another part of the visible light into the invisible light.

In an embodiment, the light converting structure included in the proximity sensing device of the present invention further comprises a light filtering layer, and the light filtering layer is disposed on the light converting structure to block the visible light.

In an embodiment, the semiconductor chip included in the proximity sensing device of the present invention is a blue light chip, blue light emitting diode, and blue laser diode.

In an embodiment, the fluorescent material included in the proximity sensing device of the present invention is configured to partially convert the visible light into another visible light.

Another objective of the present invention is to provide a display device which comprises an OLED panel and a proximity sensing device of any of the above embodiments, and the proximity sensing device is disposed under the OLED panel to be shielded by the OLED panel.

Accordingly, benefits that can be provided by the present invention are at least as follows: the invisible light emitted by the emitting module has a peak wavelength that is not less than 1000 nm so that, when the invisible light penetrates through the OLED panel, the OLED panel will not generate a visible light, and thus no bright spot will be unexpectedly displayed on the OLED panel and observed by the user. Additionally, the peak wavelength of the invisible light is preferably not larger than 1580 nm so that the invisible light can effectively penetrate through the OLED panel to achieve the purpose of sensing the proximity of an object.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Specific embodiments of the present invention will be described specifically hereinafter. However, the present invention may be implemented with various different forms of embodiments without departing from the spirit of the present invention, and the scope claimed in the present invention should not be construed as being limited to what described in the specification. Additionally, technical contents of various implementations in the above summary of the invention may also serve as the technical contents of the embodiments or as possible variants of the embodiments. Moreover, the orientation described hereinafter (e.g., front, back, upper, lower, two sides, internal, external or the like) are relative orientations, and may be defined according to the use status of the proximity sensing device and the display device to which the proximity sensing device is applied.

Figure 1A:
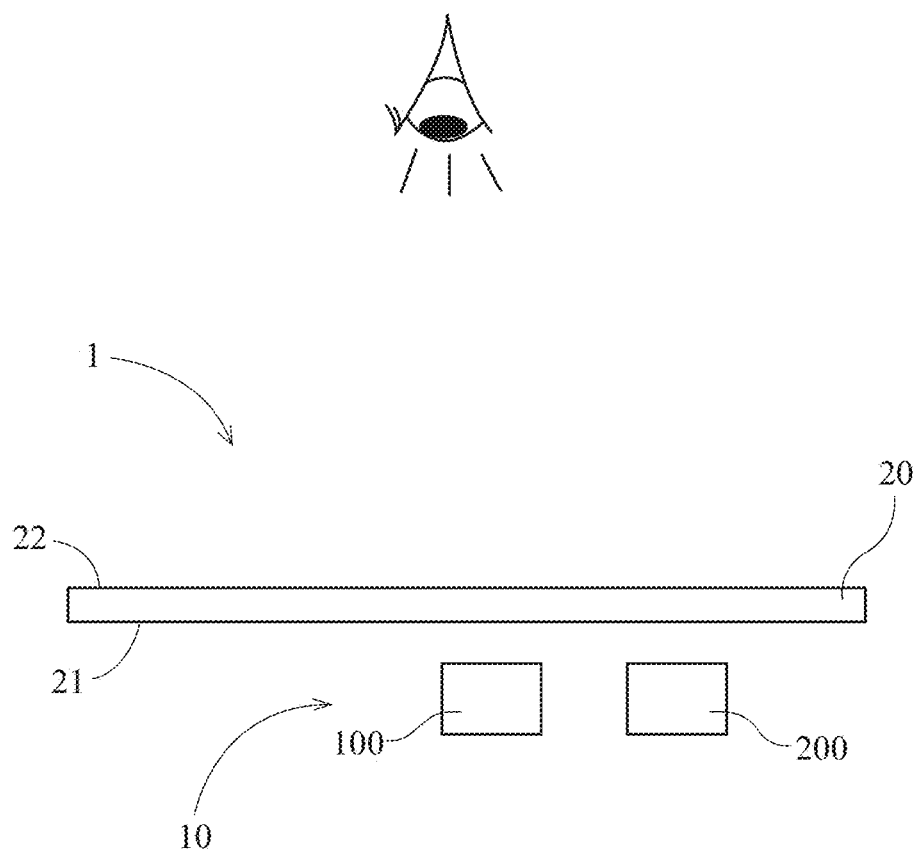
FIG. 1A and FIG. 1B are respectively a side view and a top view of a proximity sensing device according to a preferred embodiment of the present invention.
Figure 1B:
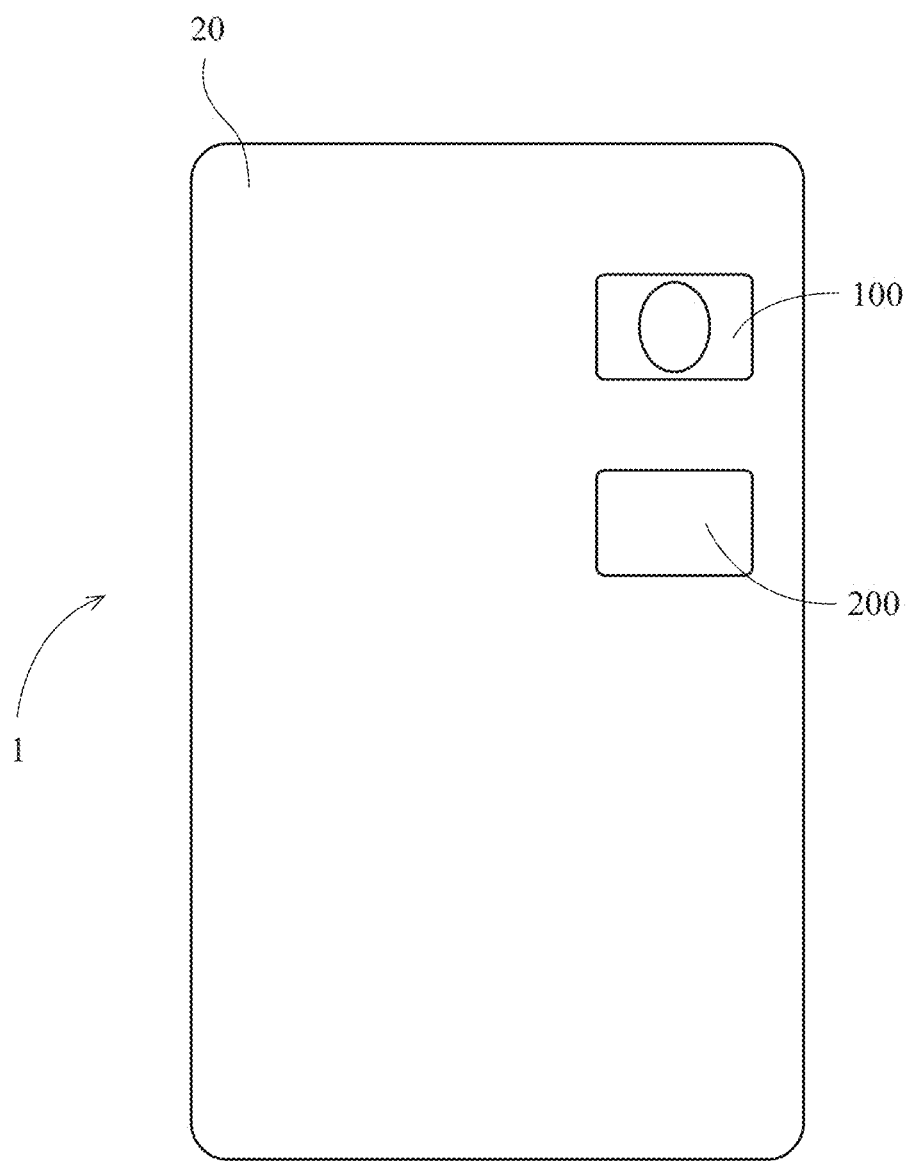

FIG. 1A and FIG. 1B are respectively a side view and a top view of a proximity sensing device 10 according to a first preferred embodiment of the present invention. The proximity sensing device 10 is disposed under an OLED panel 20 (which is called a panel 20 for short hereinafter) of a display device 1. In other words, the display device 1 at least comprises the panel 20 and the proximity sensing device 10. The display device 1 may be a display device of an electronic product such as a mobile phone, a digital camera, a computer, a television, a wearable device or the like, and this embodiment takes a mobile phone as an example. The display device 1 also has other elements, such as a driver chip or the like. Since these other elements are not the key point of this embodiment and do not affect the later description of the technical content of this embodiment, and thus are omitted from depiction.

More specifically, the proximity sensing device 10 is disposed at a lower side 21 (or called an inner side) of the panel 20 (i.e., a side where a substrate of the panel 20 is located) that generally will not be observed by a user. Thus, the proximity sensing device 10 is shielded by the panel 20 and will not be observed by the user. In contrast to the lower side 21, the panel 20 additionally comprises an upper side 22 which may also be called an external side, i.e., a side where the glass of the panel is located. Preferably, the proximity sensing device 10 may contact with the lower side 21 without interval therebetween in order to increase the accuracy of sensing. Alternatively, depending on tolerance of the assembling or the like, a small distance, e.g., 0.3 mm to 0.7 mm, may also be maintained between the proximity sensing device 10 and the lower side 21. Additionally, the panel 20 does not need to have a through hole through which light can pass in response to the arrangement of the proximity sensing device 10, and the panel 20 may be a general panel that is commercially available on the market, such as an AMOLED sold by Samsung. In other words, the panel 20 used in cooperation with the proximity sensing device 10 may be a panel of general specification or structure, so the technical content of the panel 20 shall be known by those of ordinary skill in the art and thus will be omitted from depiction.

Figure 2:
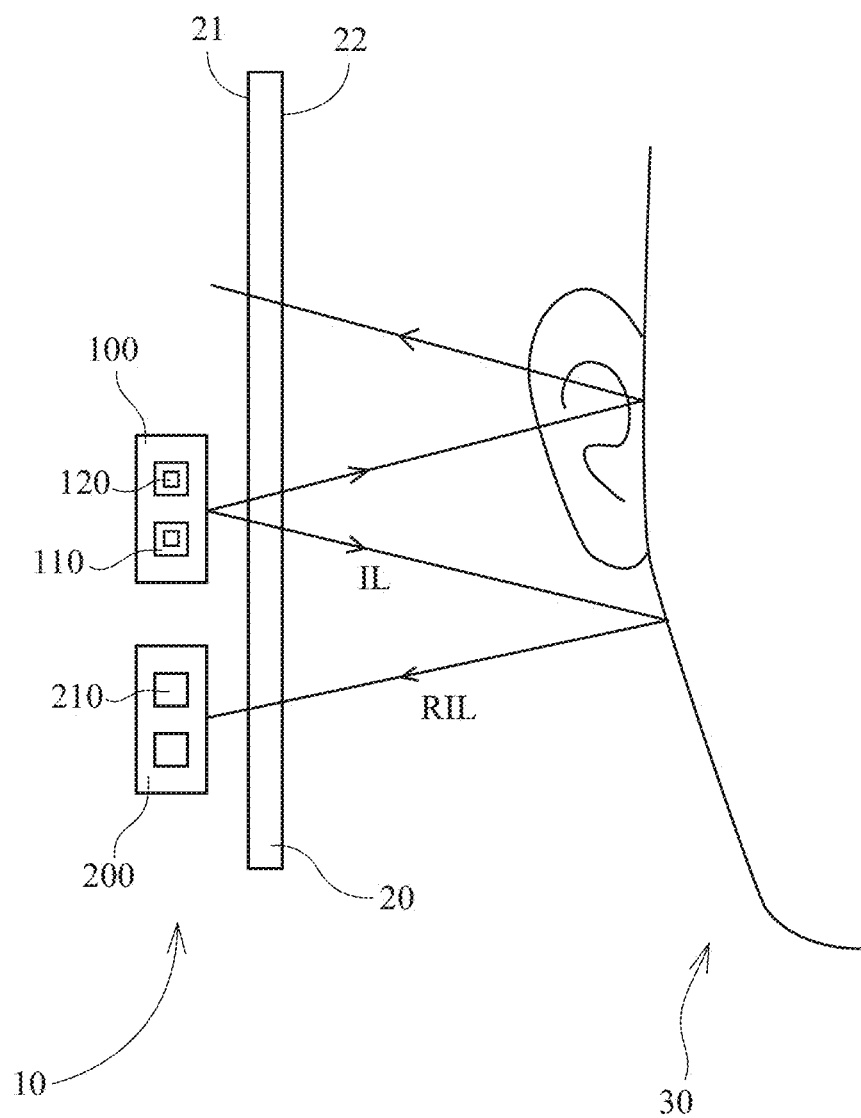
FIG. 2 is a schematic view illustrating the operation of a proximity sensing device according to a preferred embodiment of the present invention.

Referring to FIG. 2 together, the proximity sensing device 10 structurally includes at least one emitting module 100 and a receiving module 200 that are optically coupled with each other. That is, the emitting module 100 may emit an invisible light IL, and the receiving module 200 optically coupled with the emitting module 100 may receive a reflected light RIL of the invisible light IL. For this reason, the receiving module 200 is disposed adjacent to the emitting module 100 at a side of the emitting module 100, and the distance between the receiving module 200 and the emitting module 100 is sufficient to achieve the above-described optical coupling therebetween. Thus, the receiving module 200 may be regarded as being disposed adjacent to the emitting module 100 or the optical coupling therebetween may be regarded as being achieved as long as the receiving module 200 is able to receive the reflected light RIL generated by the emitting module 100. In addition, the receiving module 200 and emitting module 100 are not limited to be located on a same horizontal plane, and the optical coupling therebetween can still be achieved in spite of the difference in height therebetween.

The invisible light IL emitted by the emitting module 100 has a peak wavelength which is not less than 1000 nanometers (nm), so the invisible light IL may be regarded as an infrared light. If an object 30 (e.g., a user's cheek) is on the upper side 22 of the panel 20, then after the invisible light IL penetrates through the panel 20, the invisible light IL will be reflected by the object 30 and defined as the reflected light RIL, and the reflected light RIL penetrates through the panel 20 and is received by the receiving module 200. The receiving module 200 may then generate a corresponding signal and transmit the signal to other elements for processing or application. The peak wavelength of the invisible light IL is set to be not less than 1000 nanometers, instead of 940 nanometers used by general proximity sensors, so the invisible light IL will not make the semiconductor layer of the panel 20 emit light.

Figure 3A:
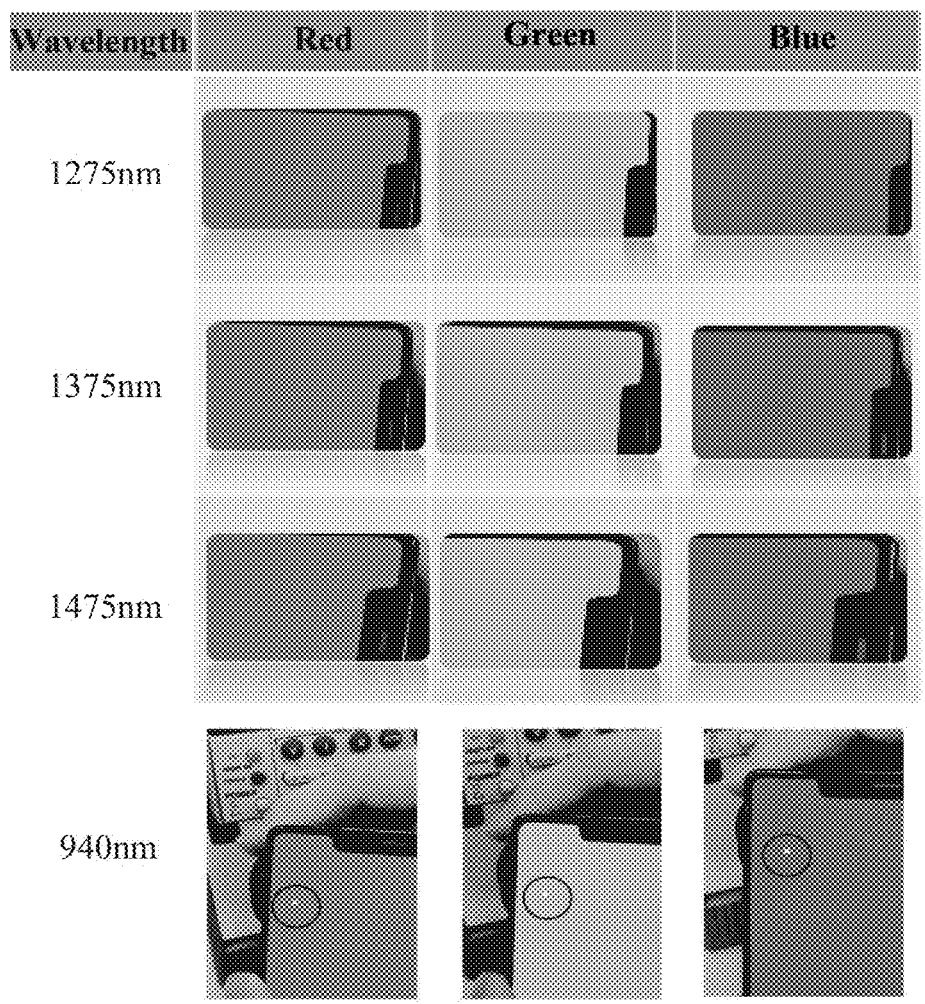
FIG. 3A is a schematic view illustrating relationships between wavelengths of the invisible light and images displayed on a panel according to a preferred embodiment of the present invention.

Referring to FIG. 3A, the influence on the panel 20 by the invisible light IL of which the wavelength ranges from 1000 to 1580 nanometers has been tested, and as can be known from results of the test, the invisible light IL will not generate a bright spot on the panel 20 when the panel 20 displays red, green, blue, and white images. FIG. 3A only shows the test results of 1275 nanometers, 1375 nanometers and 1475 nanometers (without a bright spot), and the test result of 940 nanometers shows that the panel 20 generates a bright spot.

Figure 3B:
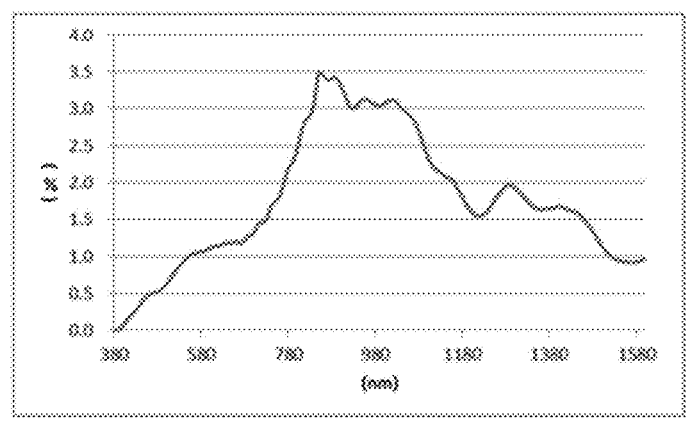
FIG. 3B is a schematic view illustrating the change in the penetration rate of a panel as a function of the wavelength of an invisible light according to a preferred embodiment of the present invention.

Referring to FIG. 3B, it shall be additionally appreciated that, although no bright spot will be generated on the panel 20 when the wavelength of the invisible light IL is greater than 1580 nanometers, the penetration rate of the panel 20 by such invisible light IL will be less than 1% so that it is hard for the receiving module 200 to receive its reflected light RIL (i.e., the invisible light IL cannot effectively penetrate through the panel 20). Therefore, as the proximity sensing device 10 of the mobile phone, the peak wavelength of the invisible light IL generated by the emitting module 100 is preferably not greater than 1580 nanometers. However, if the penetration rate of the panel 20 can be improved, then the wavelength of the invisible light IL to be used can be increased to be greater than 1580 nanometers.

Referring back to FIG. 2, the emitting module 100 may comprise one or a plurality of emitting elements 110 (located within the same packaging structure), and each emitting element 110 may emit the invisible light IL. Correspondingly, the receiving module 200 may comprise one or a plurality of sensing elements 210 (located within the same packaging structure), and each sensing element 210 may receive the reflected light RIL. The intensity of the invisible light IL generated by the entire emitting module 100 will be larger if the number of the emitting elements 110 is larger; and the receiving module 200 can receive more reflected lights RIL (or more easily receive the reflected lights RIL) on the whole if the number of the sensing elements 210 is larger. In this way, the sensing ability (distance or range) of the proximity sensing device 10 may be improved. The emitting module 100 and the receiving module 200 described above may also be provided individually on the same circuit board (a printed circuit board), or assembled integrally (not shown) or the like.

In this embodiment, the emitting element 110 comprises a semiconductor chip 120 which may directly emit the invisible light IL of which the wavelength is not less than 1000 nanometers. In other words, the emitting element 110 is an infrared LED chip, and the LED chip can emit infrared light without in association with a fluorescent material or the like. The sensing element 210 may comprise a phototransistor.

Figure 4A:
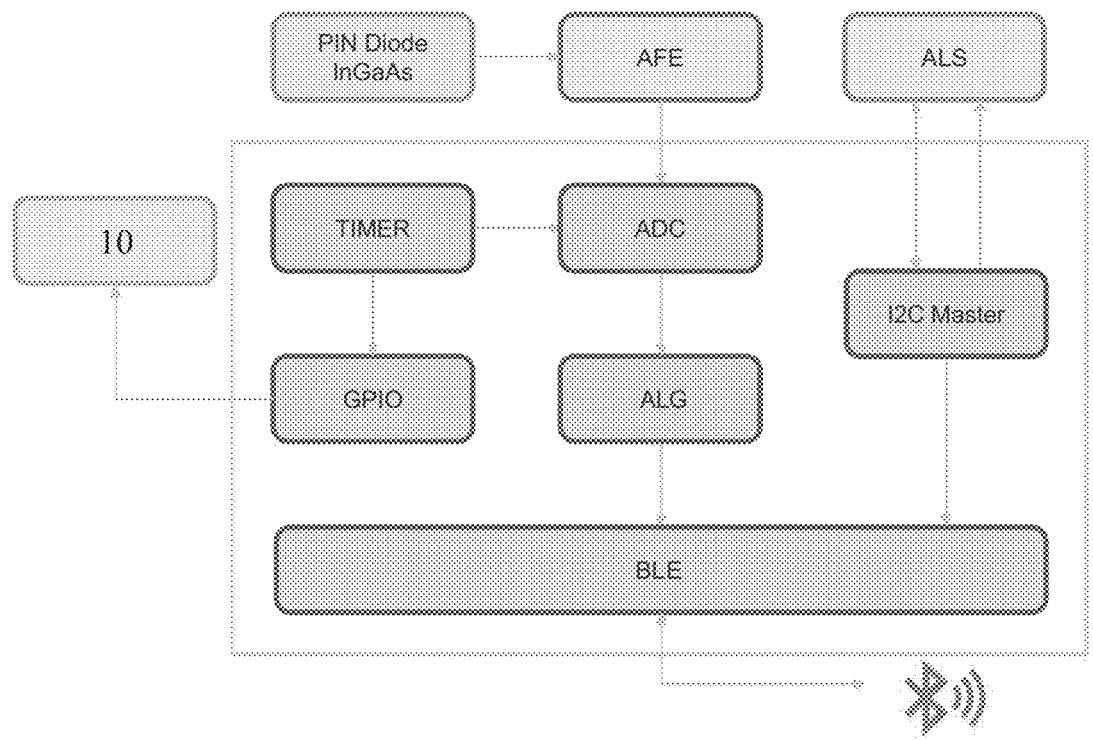
FIG. 4A is a schematic view of a test system of a proximity sensing device according to a preferred embodiment of the present invention.

Referring to FIG. 4A, in this embodiment, a test system is proposed to test the relationship between the proximity sensing device 10 and the panel 20. The test system may comprise, for example, an Ambient Light Sensor ALS, a General-Purpose Input/Output GPIO, an Analog-to-Digital Converter ADC, an Analog Front End AFE, an Algorithm ALG, a Bluetooth Low Energy transceiver BLE, and an Inter-Integrated Circuit I2C. The test system further comprises a proximity sensing device 10 and/or a conventional proximity sensor (PIN Diode In GaAs). Thus, it is possible to test the influence of the proximity sensors of different working wavelengths on the panel (bright spot, penetration rate, etc.).

Figure 4B:
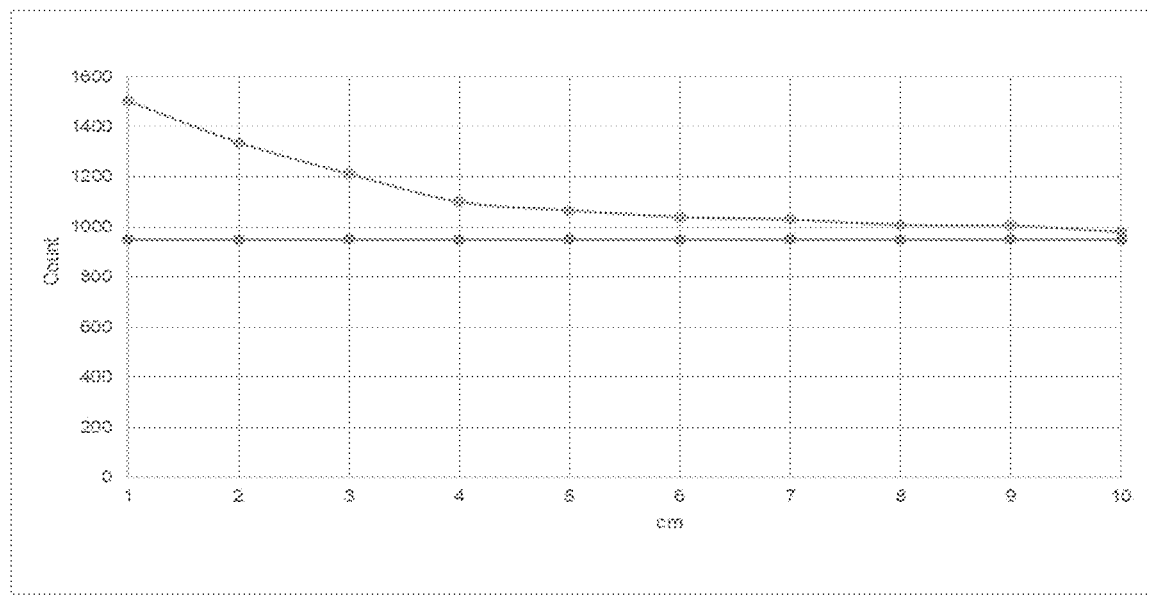
FIG. 4B is a schematic view illustrating the change in the reaction as a function of the testing distance of a proximity sensing device according to a preferred embodiment of the present invention.

Referring to FIG. 4B, the test system described above may be used to test the sensing capability of the proximity sensing device 10. For example, when the wavelength of the invisible light IL is 1375 nanometers, as the distance between the object 30 and the panel 20 becomes larger, the receiving module 200 receives less light, and the corresponding count is lower, i.e., closer to a reference value of 950.

The emitting element 110 of the proximity sensing device 10 in the above embodiment is an infrared LED chip, while in the following embodiments, the emitting element 110 is of a different type to reduce the price thereof and/or the full width at half-maximum (FWHM) of the invisible light thereof.

Figure 5:
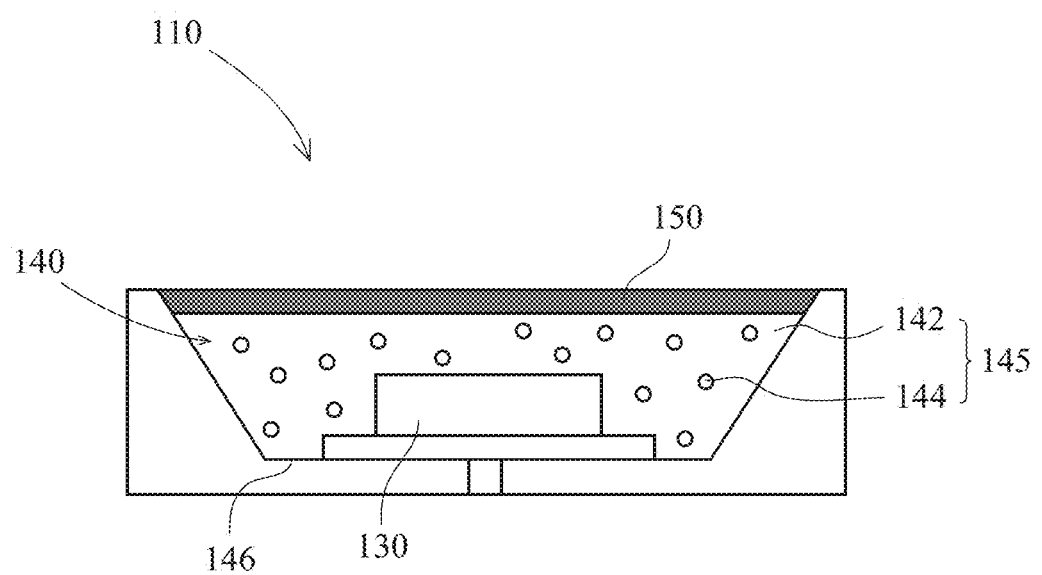
FIG. 5 is a schematic structural view (cross-sectional view) of a proximity sensing device according to a preferred embodiment of the present invention.
Figure 6:
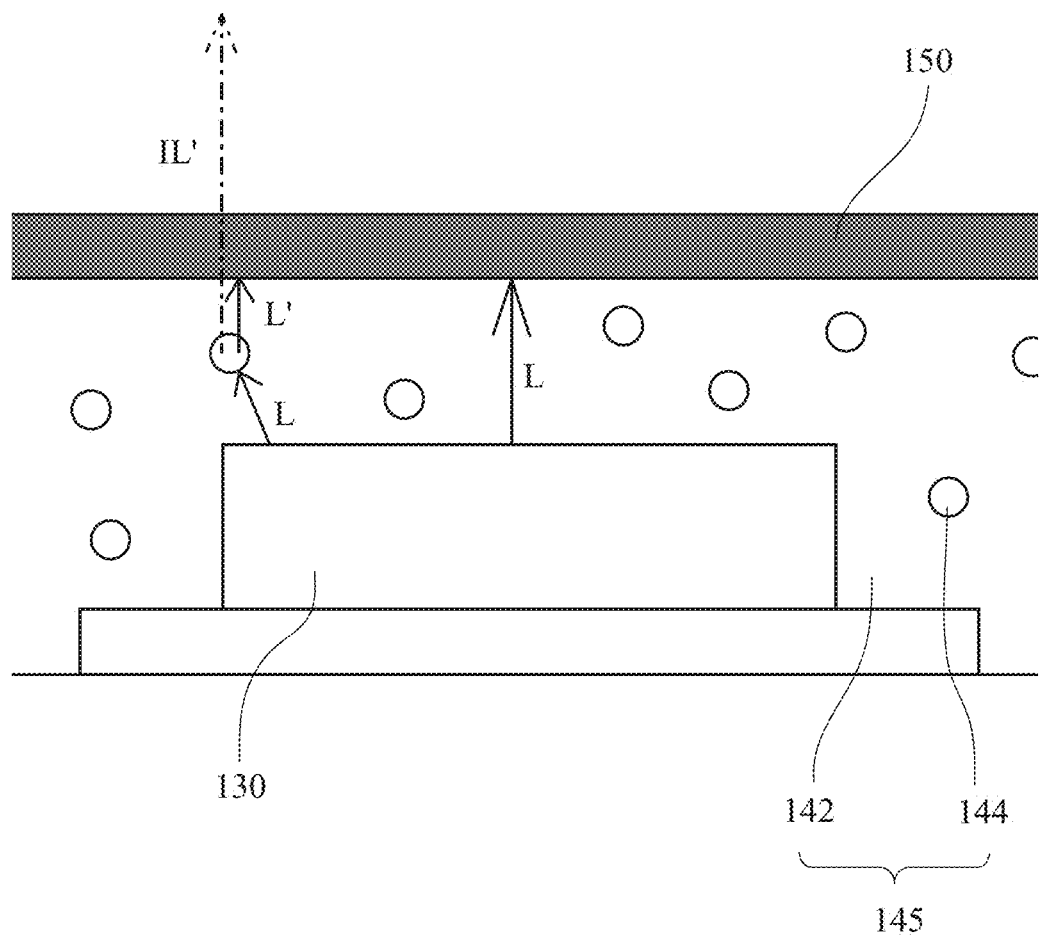
FIG. 6 is a partially enlarged view of a proximity sensing device of FIG. 5.

Referring to FIG. 5 and FIG. 6, a second preferred embodiment differs from the first embodiment in that, the emitting element 110 may comprise a semiconductor chip 130 and a light converting structure 140, the semiconductor chip 130 is configured to emit a visible light L, and the light converting structure 140 is disposed on the semiconductor chip 130 to convert the visible light L into an invisible light IL' of which the wavelength is not less than 1000 nm.

More specifically, the semiconductor chip 130 may be, for example, a blue LED chip, a blue light emitting diode, or a blue laser diode, so the visible light L emitted from the semiconductor chip 130 is blue light. According to the packaging configuration, the semiconductor chip 130 may be provided on a lead frame 146 or a substrate (both of which may be regarded as a constituent/element of the emitting element 110). The light converting structure 140 at least covers above the semiconductor chip 130 so that the visible light L passes through the light converting structure 140 before being emitted to the outside of the emitting element 110. In this embodiment, the light converting structure 140 further covers and encapsulates the semiconductor chip 130. In addition, the light converting structure 140 includes an adhesive 142 and a fluorescent material 144, the adhesive 142 is a light-transparent packaging adhesive (e.g., silicon resin) that is commonly used in the LED chip, and the fluorescent material 144 is disposed and distributed in the adhesive 142 and may convert the visible light L into the invisible light IL'. The weight ratio (wt %) of the adhesive 142 to the fluorescent material 144 may be 100: 100 to 100: 150, without being limited thereto.

The fluorescent material 144 comprises various kinds of fluorescent powders capable of exciting a light of which the wavelength is not less than 1000 nanometers. For example, the fluorescent material 144 is a fluorescent powder having a tetrahedral structure with a chemical formula of $La_3Si_6N_{11}$: Cr, Ce, and an average particle diameter thereof is 15 microns (μm). When the fluorescent material 144 is irradiated by the visible light L of which the peak wavelength is 460 nanometers (blue light), a visible light L' of which the peak wavelength is 550 nanometers and an invisible light IL' of which the peak wavelength is 1550 nanometers can be excited. The invisible light IL' can be used for sensing the proximity of the object and does not generate a bright spot on the panel 20, as described in the previous embodiment.

Since the fluorescent material 144 also excites the visible light L', and it shall be difficult for the fluorescent material 144 to completely convert the visible light L emitted from the semiconductor chip 130 into the invisible light IL', a color spot may be generated on the panel 20 when the visible lights L and L' are emitted to the outside of the emitting element 110. Thus, the emitting element 110 may further comprise a light absorbing layer 150 which is provided on the light converting structure 140 to absorb the visible lights L and L'. In this way, only the invisible light IL' can be emitted to the outside of the emitting element 110, and no bright spot or color spot will be generated on the panel 20. The light absorbing layer 150 may specifically comprise a light-transparent adhesive and a dye, and the dye is mixed with the adhesive to form a black slurry which is capable of absorbing the visible light. The weight ratio (wt %) of the adhesive to the dye may range from 100: 30 to 100: 60, without being limited thereto. The light absorbing layer 150 can absorb the light of which the wavelength is below 900 nanometers, so the visible light L and L' cannot pass through the light absorbing layer 150.

One of the fabrication processes of the emitting element 110 described above may be as follows: the fluorescent material 144 and the adhesive 142 are mixed in a desired proportion into a mixed slurry 145, and then the mixed slurry 145 is applied onto the lead frame 146 to cover the semiconductor chip 130; then the mixed slurry 145 is baked and heated so that the mixed slurry 145 is cured to form the light converting structure 140; then the dye and another adhesive are mixed in a desired proportion into a black slurry, and then the black slurry is applied onto the top surface of the cured light converting structure 140; and finally, the black slurry is baked and heated so that the black slurry is cured to form the light absorbing layer 150.

It shall be additionally appreciated that, the fluorescent material 144 may also comprise fluorescent powders of the following chemical structures: $La_{3(1-x)}Ga_{1-y}Ge_{5(1-z)}O_{16}$: $3xA^{3+}, yCr^{3+}, 5zB^{4+}$, wherein x, y and z are not zero at the same time, A represents at least one of Gd and Yb, and B represents at least one of Sn, Nb and Ta; $La_3Ga_{5(1-x)}M1O_{14}$: $5xCr^{3+}$, wherein $0.01 \leq x \leq 0.1$, M1 is Si or Ge; $La_{3(1-x)}Ga_{5(1-y)}GeO_{14}$:$3xSm^{3+},5yCr^{3+}$, wherein $0.01 \leq x \leq 0.5$ and $0.01 \leq y \leq 0.1$; $Ca_3Ga_{2-x}Ge_3O_{12}$:$xCr^{3+}$, wherein $0 \leq x \leq 0.1$; $LaGa_{1-x}Ge_2O_7$:$xCr^{3+}$, wherein $0 \leq x \leq 0.2$; $BaZr_{1-x}Si_3O_9$: $xCr^{3+}$, wherein $0 \leq x \leq 0.1$; $Zn_3Al_{2-x}Ge_4O_{14}$:$2xCr^{3+}$, wherein $0 \leq x \leq 0.2$; $Ca_2Ga_{2(1-x)}GeO_7$:$2xCr^{3+}$, wherein $0 \leq x \leq 0.1$; $Zn_3Ga_{2(1-x)}Ge_yO_{(6+2y)}$:$xCr^{3+}$, wherein $0 \leq x \leq 0.5$, and y is an integer ranging from 1 to 5; $Zn_3Ga_{2(1-x)}Ge_4O_{14}$:$2xCr^{3+}$, wherein $0 \leq x \leq 0.2$. Each of the above-mentioned fluorescent materials can generate the invisible light of which the wavelength is not less than 1000 nanometers, and reference may be made to Taiwan Patent Application Nos. 107143240 and 107130643 of the applicant for the specific technical contents and implementations thereof, and these applications are incorporated herein by reference in their entirety.

As compared with the first embodiment, the emitting element 110 of this embodiment may have a lower price, because the price of the semiconductor chip 130 (the blue LED chip) is much lower than that the semiconductor chip 120 (the infrared LED chip) even if the production costs of the light converting structure 140 and the light absorption layer 150 are taken into consideration. Furthermore, the full width at half-maximum of the invisible light IL' emitted by the emitting element 110 of this embodiment is about 78 nanometers, which is more preferable than that of the first embodiment (which is about 110 nanometers).

Figure 7:
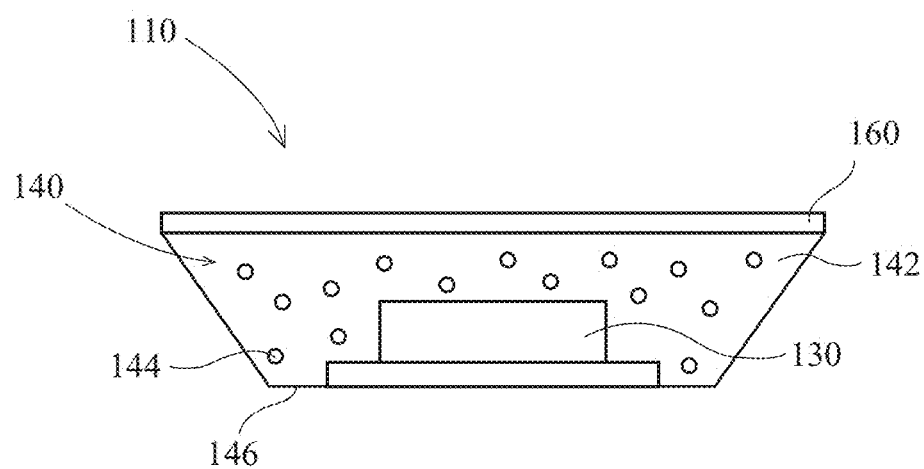
FIG. 7 is a schematic structural view of a proximity sensing device according to a preferred embodiment of the present invention.

Referring to FIG. 7, a third preferred embodiment differs from the second embodiment in that, the emitting element 110 comprises a light filtering layer 160 instead of a light absorbing layer 150. Specifically, the light filtering layer 160 may be an optical thin film that is disposed on the light converting structure 140, and the light filtering layer 160 may prevent the visible light from passing therethrough, but does not block the invisible light. That is, the light filtering layer 160 (the optical thin film) can absorb, reflect, scatter, or shift the phase or the like of a light of a specific wavelength (e.g., less than 700 or 900 nanometers) therein so that the light cannot pass through the light filtering layer 160. In this way, the visible lights L' and L (as shown in FIG. 6) cannot be emitted to the outside of the emitting element 110, but the invisible light IL' can be emitted to the outside of the emitting element 110.

Figure 8:
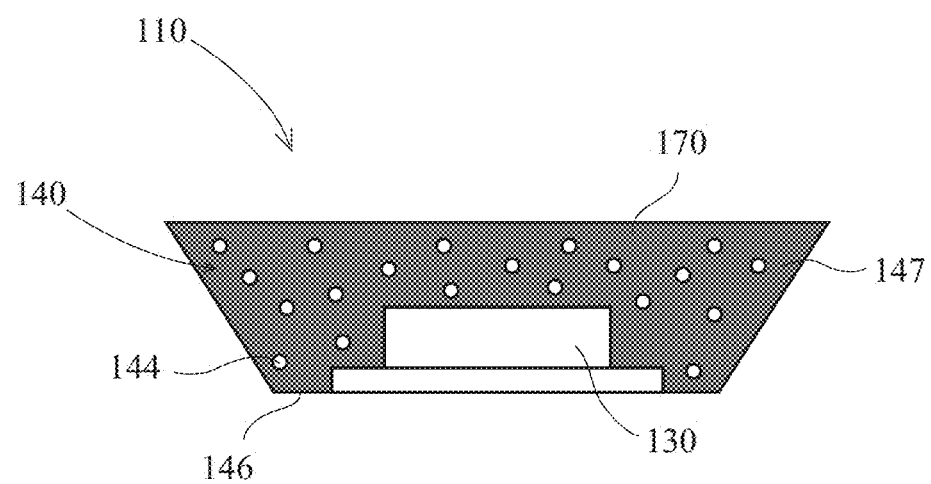
FIG. 8 is a schematic structural view of a proximity sensing device according to a preferred embodiment of the present invention.

Referring to FIG. 8, a fourth preferred embodiment differs from the second embodiment in that, the emitting element 110 may not include the light absorbing layer 150, but the light converting structure 140 further comprises a light absorbing material 170 to absorb a part of the visible light but not absorb the invisible light. Specifically, the light absorbing material 170 is provided in the adhesive 142, and the light absorbing material 170 may be a black dye and may be mixed together with the fluorescent material 144 in the adhesive 142 to form a mixed slurry 147. The mixed slurry 147 may then be provided on the lead frame 146 and cover the semiconductor chip 130. In this way, the fluorescent material 144 in the adhesive can covert a part of the visible light L into the visible light L' and invisible light IL'; another part of visible light L (which has not been covered by the fluorescent material 144) and the visible light L' excited by the fluorescent material 144 (as shown in FIG. 6) will be absorbed by the light absorbing material 170 and thus cannot pass through the light converting structure 140, but the invisible light L' can pass through the light converting structure 140.

It shall be appreciated that, no matter whether or not they can completely absorb, filter, or block the visible light, the light absorbing layer 150, the light filtering layer 160 or the light absorbing material 170 are covered within the scope claimed in the present invention. In other words, even if part of the visible light is emitted from the emitting element 110, the part of the visible light emitted should not generate an obviously visible color spot on the panel 20. Furthermore, if only a small portion of the visible light of the semiconductor chip 130 is not converted into the invisible light, or if only a small amount of visible light (or no visible light) is excited from the light converting structure 140, then the light absorbing layer 150, the light filtering layer 160, or the light absorbing material 170 may be omitted from the emitting element 110.

According to the above descriptions, the proximity sensing device of the present invention may be provided under the OLED panel to increase the screen-to-body ratio of the display device, and the invisible light for sensing the proximity has a peak wavelength not less than 1000 nanometers so that the generation of a bright spot due to photoluminescence on the OLED panel can be avoided.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A proximity sensing device disposed under an OLED panel, comprising:
    an emitting module, being configured to emit an invisible light which has a peak wavelength not less than 1000 nm; and
    a receiving module, being disposed adjacent to the emitting module and configured to receive a reflected light of the invisible light;
    wherein the emitting module includes one or more emitting elements, wherein each emitting element includes a semiconductor chip and a light converting structure, wherein the semiconductor chip is configured to emit a visible light, and the light converting structure is disposed on the semiconductor chip and includes an adhesive and a fluorescent material, wherein the fluorescent material is disposed in the adhesive to convert the visible light into the invisible light.

2. The proximity sensing device of claim 1, wherein the peak wavelength of the invisible light emitted by the emitting module is not greater than 1580 nm.

3. The proximity sensing device of claim 1, wherein the receiving module comprises one or a plurality of sensing elements.

4. The proximity sensing device of Claim 1, wherein the emitting element further comprises a light absorbing layer, and the light absorbing layer is disposed on the light converting structure to absorb the visible light.

5. The proximity sensing device of Claim 1, wherein the light converting structure further comprises a light absorbing material, and the light absorbing material is disposed in the adhesive to absorb a part of the visible light.

6. The proximity sensing device of Claim 1, wherein the emitting element further comprises a light filtering layer, and the light filtering layer is disposed on the light converting structure to block the visible light.

7. The proximity sensing device of Claim 1, wherein the semiconductor chip is a blue light chip, a blue light emitting diode, or a blue laser diode.

8. A display device, comprising:
an OLED panel; and
a proximity sensing device of claim 1, being disposed under the OLED panel to be shielded by the OLED panel.

9. The display device of claim 8, wherein the peak wavelength of the invisible light emitted by the emitting module is not greater than 1580 nm.

10. The display device of claim 8, wherein the receiving module comprises one or a plurality of sensing elements.

11. The display device of claim 8, wherein the emitting element further comprises a light absorbing layer, and the light absorbing layer is disposed on the light converting structure to absorb the visible light.

12. The display device of claim 8, wherein the light converting structure further comprises a light absorbing material, and the light absorbing material is disposed in the adhesive to absorb a part of the visible light.

13. The display device of claim 8, wherein the emitting element further comprises a light filtering layer, and the light filtering layer is disposed on the light converting structure to block the visible light.

14. The display device of claim 8, wherein the semiconductor chip is a blue light chip, a blue light emitting diode, or a blue laser diode.

* * * * *